Figure 1:
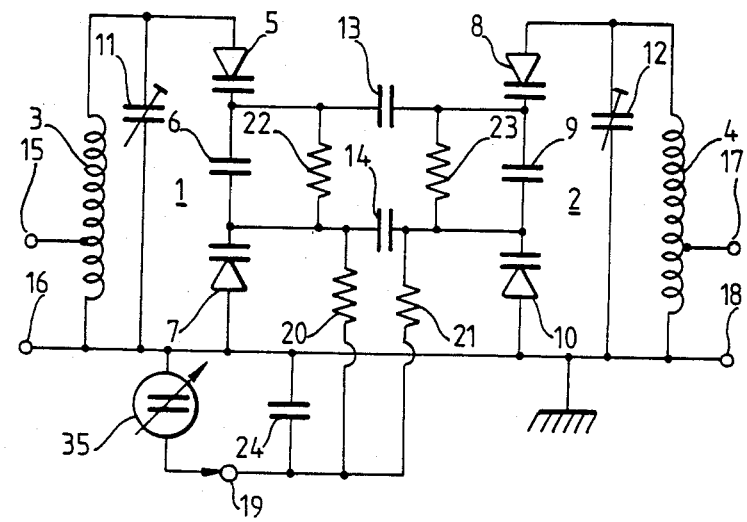

United States Patent [19]

Speake

[11] Patent Number: 4,839,617
[45] Date of Patent: Jun. 13, 1989

[54] BANDPASS FILTER CIRCUIT ARRANGEMENT

[75] Inventor: John D. Speake, Cambridge, England

[73] Assignee: U.S. Philips Corporation, New York, N.Y.

[21] Appl. No.: 275,044

[22] Filed: Nov. 22, 1988

[30] Foreign Application Priority Data

Nov. 27, 1987 [GB] United Kingdom ............... 8727831

[51] Int. Cl.$^4$ .............................................. H03H 7/01
[52] U.S. Cl. ..................... 333/174; 333/167; 333/175
[58] Field of Search ............. 333/167, 168, 174, 175, 333/176, 12, 177–180, 24 R, 24 C

[56] References Cited

U.S. PATENT DOCUMENTS

| 3,624,514 | 11/1971 | Putzer | 334/15 X |
| 3,646,449 | 2/1972 | Hellbarth et al. | 334/15 X |
| 4,316,108 | 2/1982 | Rogers, Jr. | 455/339 X |

FOREIGN PATENT DOCUMENTS 2555847  3/1985  France .
1295850  11/1972  United Kingdom .
2172160  9/1986  United Kingdom .

Primary Examiner—Marvin L. Nussbaum
Attorney, Agent, or Firm—David R. Treacy

[57] ABSTRACT

A bandpass filter comprises a reactively intercoupled pair of parallel-resonant circuits (1, 2) to one of which a pair of signal input terminals (15, 16) are connected and to the other of which a pair of output terminals (17, 18) are connected. Tuning of the filter is accomplished by varying the capacitive component of each circuit by means of a tuning voltage applied to a further input (19). In order to compensate for the deviation from the optimum intercoupling which would otherwise occur with change of tuning frequency the capacitive component of each resonant circuit comprises at least three capacitors (5, 6, 7 and 8, 9, 10) in series, each set of three capacitors effectively forming a variable capacitive voltage divider. The two junction points of the three capacitors of each set are each connected to the corresponding junction point in the other set by means of a respective bidirectional reactive coupling (13 and 14 respectively).

8 Claims, 1 Drawing Sheet

BANDPASS FILTER CIRCUIT ARRANGEMENT

DESCRIPTION

This invention relates to a bandpass filter circuit arrangement comprising first and second parallel-resonant circuits each of which comprises an inductive component and a capacitive component, each said capacitive component comprising a pair of capacitors in series, a capacitor of each pair being variable in step with variation of the corresponding capacitor of the other pair, a bidirectional reactive coupling being provided between a point on the connection between the capacitors of one pair and a point on the connection between the capacitors of the other pair.

A filter arrangement of this type is disclosed in patent specification GB-A-1 295 850 (FIG. 4 as modified by FIG. 5 and the corresponding description) to which U.S. Pat. No. 3,624,514 corresponds. In this known filter the bidirectional coupling includes a series capacitor and each variable capacitor is varied in step with variation of tuning capacitors which tune the respective resonant circuits, in order to obtain substantially constant matching of the filter to the output impedance of a transistor which feeds it, over the complete tuning range.

Bandpass R.F. filters are used extensively in radio communication equipment for many purposes such as the rejection of spurious response frequencies in superhet receivers, suppression of unwanted radiation from oscillators, impedance transformation, etc. A typical such filter consists of two or more parallel resonant circuits, with a bidirectional coupling between each resonant circuit and the next. Many types of coupling are possible, and are well documented in the standard reference books. The most commonly used, because of its simplicity and low cost, is so-called "top capacitance coupling" in which one common point of the capacitive component and the inductive component of each resonant circuit is connected to the corresponding point on the next resonant circuit (if present) via a series-capacitor (the other such common points being connected to ground). The value of the or each series capacitor is chosen so that the required degree of coupling is obtained; usually this means that the value of each series capacitor has to have a particular relationship to the value of the capacitive component of each of the two resonant circuits which it intercouples, for example to obtain so-called "critical coupling". This means that if a filter which employs simple top capacitance coupling is required to be tunable over a substantial frequency range, for example a frequency range exceeding 10% of a frequency within this range, the tuning has to be done by adjusting the inductive components of the various resonant circuits, e.g. by means of adjustable ferrite cores, because adjustment of the capacitive components would result in an impermissible change of the degree of coupling from the optimum. Thus variable capacitance diodes cannot be used for tuning such filters over a substantial frequency range; if they were, a filter which is optionally coupled in the centre of the tuning frequency range would be substantially overcoupled at the upper end of this range and substantially under-coupled at the lower end.

It is an object of the invention to enable this disadvantage to be mitigated and to this end a bandpass filter arrangement of the kind specified in the opening paragraph is characterized in that each said capacitive component includes a respective further capacitor in series with the capacitors of the corresponding pair and in that a further bidirectional reactive coupling is provided between a point on the connection between one said further capacitor and the pair of capacitors corresponding thereto and a point on the connection between the other said further capacitor and the pair of capacitors corresponding thereto.

It has now been recognised that the change of coupling which occurs with a change of tuning frequency achieved by a variation of tuning capacitance can be reduced by connecting the bidirectional reactive coupling provided between the relevant pair of resonant circuits between a tap on the capacitive component of one circuit and a corresponding tap on the capacitive component of the other circuit. If each said capacitive component consisted solely of a pair of capacitors in series, one being fixed and the other being variable and with the junction of these capacitors constituting the corresponding tap, then although the effective change of position of each tap on the capacitive divider formed by the corresponding pair of capacitors produced by variation of the corresponding variable capacitor can be made to change the coupling between the two resonant circuits in the correct direction to obtain compensation for the change in coupling in which would otherwise occur with a change in tuning frequency, in many circumstances it would be very difficult to obtain the correct amount of compensation, at least without other problems being created. Obviously the value of each fixed capacitor determines the amount of compensation obtained, but the range within which this value must lie is often limited by other considerations. For example, if this value is small, insufficient tuning range may be obtainable by means of the corresponding variable capacitance. Conversely, if this value is large, any signal processed by the filter will occur across the corresponding variable capacitor with a comparatively large amplitude, resulting in the creation of a comparatively large amount of distortion in the signal if the variable capacitor is a non-linear device such as a variable capacitance diode. Therefore according to the invention each capacitive component is arranged to include a respective further capacitor in series with the capacitors of the corresponding pair and a further bidirectional reactive coupling is provided between a point on the connection between one said further capacitor and the pair of capacitors corresponding thereto and a point on the connection between the other said further capacitance and the pair of capacitors corresponding thereto. This expedient gives rise to great freedom in choosing the values of the capacitors making up each said capacitive component to obtain the required degree of compensation, because these values and the values of the reactances of the two bidirectional couplings are interdependent; the latter can be adjusted, for example, by implementing them in the form of respective series-capacitors or other reactive components and choosing the values of these appropriately.

As is known, distortion produced in a signal processed by a filter employing a single variable capacitance diode as tuning capacitor, due to the non-linear characteristic of the diode, can be reduced by replacing the single diode by a pair of such diodes connected back-to-back. Preferably, therefore, each said further capacitor provided in accordance with the invention is itself variable in step with variation of the other said further capacitor, and the capacitor of the corresponding pair to which it is connected is fixed, means being provided for varying the capacitances of all said variable capacitors simultaneously. If this is the case, and each variable capacitor is in the form of a variable capacitance diode, the provision of the further capacitors in accordance with the invention can give rise to the further benefit of reduced distortion.

Figure 2:
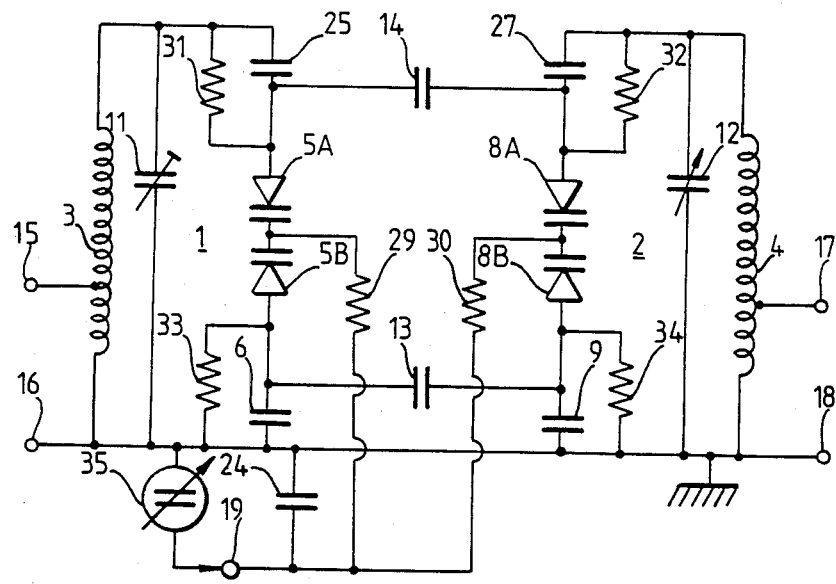

Embodiments of the invention will now be described, by way of example, with reference to the accompanying diagrammatic drawing in which FIG. 1 is the circuit diagram of a first embodiment, and FIG. 2 is the circuit diagram of a second embodiment.

In FIG. 1 a bandpass filter circuit arrangement comprises first and second parallel-resonant circuits 1 and 2 respectively, each of which comprises an inductive component and a capacitive component. The inductive components of these circuits are in the form of coils 3 and 4 respectively. The capacitive component of resonant circuit 1 comprises a pair of series-capacitors 5 and 6 having a further capacitor 7 connected in series with it, the series combination of the capacitors 5, 6 and 7 being connected in parallel with the coil 3. Similarly, the capacitive component of resonant circuit 2 comprises a pair of series-capacitors 8 and 9 having a further capacitor 10 connected in series with it, the series combination of the capacitors 8, 9 and 10 being connected in parallel with the coil 4. Trimming capacitors 11 and 12 are also connected in parallel with the coils 3 and 4 respectively. The junction point of coil 3 and capacitor 7 is connected to ground, as is the junction point of coil 4 and capacitor 10. A first bidirectional reactive coupling implemented as a series-capacitor 13 is provided between the junction point of capacitors 5 and 6 and the junction point of capacitors 8 and 9. Similarly, a second bidirectional reactive coupling implemented as a series-capacitor 14 is provided between the junction point of capacitors 6 and 7 and the junction point of capacitors 9 and 10. Input terminals 15 and 16 are connected to a tap on coil 3 and to ground, respectively, and output terminals 17 and 18 are connected to a tap on coil 4 and to ground respectively.

Whereas capacitors 6 and 9 are fixed, capacitors 5, 7, 8 and 10 are variable and are in the form of variable capacitance diodes. In order to vary the capacitances of these diodes in step with each other and hence to tune the filter, a variable reverse-bias voltage relative to ground can be applied from a source 35 to a tuning voltage input terminal 19. In the present example terminal 19 is connected to the cathodes of the diodes 5, 7, 8 and 10, so the tuning voltage will be positive relative to ground. Tuning voltage input terminal 19 is connected to the cathodes of the diodes 7 and 10 via high-value series-resistors 20 and 21 respectively, these cathodes being connected in turn to the cathodes of the diodes 5 and 7 respectively via high-value series resistors 22 and 23 respectively. Terminal 19 is also decoupled to ground via a capacitor 24.

If capacitor 14 were omitted and capacitor 13 were connected between the anodes of diodes 5 and 8 rather than their cathodes (conventional top capacitance coupling) and the capacitance of capacitor 13 were chosen to given the desired degree of intercoupling between the resonant circuits 1 and 2 in the centre of the tuning range, then it would be found that the intercoupling would be greater than that desired at the high-frequency end of the tuning range and less than that desired at the low-frequency end of the tuning range, due to the change of the impedance of capacitor 13 with frequency. This effect could be mitigated somewhat by connecting capacitor 13 as shown (again in the absence of capacitor 14), because the decrease in the capacitances of diodes 5, 7, 8 and 10 required to reach the high-frequency end of the tuning range would result in the points of connection of capacitor 13 to the capacitive potential dividers 5, 6, 7 and 8, 9, 10 effectively moving down these dividers, with a corresponding converse effect if the capacitances of the diodes are increased to reach the low-frequency end of the tuning range, the effective movement of these points of connection being determined by the values of the capacitors 6 and 9. However, as has been pointed out above, in practice the range of values which capacitors 6 and 9 can take is often limited by other considerations; in one application it was found that this limitation always resulted in overcompensation for the change in impedance of capacitor 13 with frequency. Capacitor 14 is therefore also provided, connected as shown. The points of connection of capacitor 14 of the capacitive dividers 5, 6, 7 and 8, 9, 10 are such that these points effectively move up and down the respective dividers with changes in the capacitances of diodes 5, 7, 8 and 10 in opposite directions to the corresponding movements of the points of connection of capacitor 13. The presence of capacitor 14 therefore results in the compensation which would be obtained in the presence of capacitor 13 alone being reduced, the net value of compensation obtained being variable by suitably choosing the relative capacitances of capacitors 13 and 14.

In a practical filter constructed as shown in FIG. 1 the inductance of the part of each coil 3 and 4 which lies above its tap was 44 nH and the inductance of the part of each coil 3 and 4 which lies below its tap was 5nH. The values of the capacitors 6, 9, 13 and 14 were 18 pF, 18 pF, 1.17 pF and 1.54 pF respectively. Each variable capacitance diode 5, 7, 8 and 10 consisted in fact of two such diodes, available under the type number BB809, connected in parallel. The centre-frequency of the filter was tunable over a range of approximately 136 MHz to 164 MHz by varying the voltage applied to terminal 19 relative to terminal 16 over the range +2V to +20V. A substantially optimum Butterworth response was obtained over the whole of this tuning range.

It should be noted that the inevitably non-ideal behavior of various components of the filter with changing frequency may also be taken into account when choosing the relative capacitances of capacitors 13 and 14, in order to obtain at least some compensation for this behavior, if desired.

FIG. 2, in which components which have counterparts in FIG. 1 have been given the same reference numerals, is the circuit diagram of a second embodiment of the invention. In FIG. 2, a bandpass filter circuit arrangement again comprises first and second parallel-resonant circuits 1 and 2. However, the capacitive component of each of these resonant circuits is now arranged somewhat differently to the corresponding component of FIG. 1. Each such component again comprises a pair of series capacitors 5, 6 and 8, 9 respectively, where the variable capacitors 5 and 8 are now each in the form of a pair of back-to-back connected variable capacitance diodes 5A, 5B and 8A, 8B respectively, which pair has a further capacitor, 25 and 27 respectively, connected in series with it, the series combination of the capacitors 5, 6 and 25 being connected in parallel with the coil 3 and the series combination of the capacitors 8, 9 and 27 being connected in parallel with the coil 4. However each further capacitor 25 and 27 is now fixed, and is included between the corresponding variable capacitor 5 or 8 and the coil 3, rather than between the corresponding fixed capacitor 6 or 9 and ground. Capacitor 14 is now connected between the junction point of the variable capacitor 5 and the further capacitor 25 and the junction point of the variable capacitor 8 and the further capacitor 27. Because of the different circuit configuration the connections to the various variable capacitance diodes from the tuning voltage input terminal 19 are also somewhat different, terminal 19 being connected to the junction point of diodes 5A and 5B via a high-value resistor 29 and to the junction point of didoes 8A and 8B via a high-value resistor 30, and further high-value resistors 31, 32, 33 and 34 being connected in parallel with capacitors 25, 27, 6 and 9 respectively. The filter arrangement operates in a similar manner to the arrangement of FIG. 1. If, for example, the positive tuning voltage applied to terminal 19 is increased to thereby reduce the capacitances of the diodes 5A, 5B, 8A and 8B and thus increase the centre-frequency of the filter response, the points on the capacitive potential dividers 25, 5A, 5B, 6 and 27A, 8A, 8B, 9 to which capacitor 13 is connected effectively move down these dividers whereas the points to which capacitor 14 is connected effectively move up.

With coils 3, 4 having inductances identical to those quoted for FIG. 1, each diode 5A, 5B, 8A and 8B again consisting of two diodes type BB809 connected in parallel, and with the capacitors 6, 9, 13, 14, 25 and 27 having values of 36pF, 36pF, 3.9pF, 0.75pF, 36pF, and 36pF respectively the response of the filter of FIG. 2 for values of the tuning voltage applied to terminal 19 between +2V and +20V was found to be substantially the same as that obtained with the "practical filter" constructed as shown in FIG. 1.

Of course it is not essential that the capacitors 6, 9, 25 and 27 of FIG. 2 all have the same value. The ratios of the capacitance of capacitor 6 to that of capacitor 25 and of the capacitance of capacitor 9 to that of capacitor 27 may be chosen different from unity, the value of capacitor 13 and/or capacitor 14 being adjusted accordingly to obtain the desired response.

It will be evident that many modifications are possible to the arrangements described within the scope of the invention as defined by the claims. For example the capacitors 13 and/or 14 may each be replaced by a pair of capacitors in series, with the junction of the two capacitors of the pair connected to ground via a further capacitor. As another example each capacitor 13 and 14 may be replaced by an inductor, so that each bidirectional coupling between the resonant circuits 1 and 2 has an inductive rather than a capacitive reactance. However the use of capacitive rather than inductive reactances will usually be preferred, inter alia for reasons of cost.

Although the filters described have each consisted of two sections, it will be evident that the invention may be employed in filters having more than two sections. For example, the circuit shown in FIG. 1 may be extended by connecting duplicates of capacitors 13 and 14 between the common points of capacitors 8 and 9 and capacitors 9 and 10 respectively and the corresponding common points in a duplicate of resonator 2 which has these common points fed from the output of source 35 via resistors corresponding to resistors 21 and 23.

From reading the present disclosure, other modifications will be apparent to persons skilled in the art. Such modifications may involve other features which are already known in the design, manufacture and use of filters and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. A bandpass filter circuit arrangement comprising first and second parallel-resonant circuits each of which comprises an inductive component and a capacitive component, each said capacitive component comprising a pair of capacitors in series, a capacitor of each pair being variable in step with variation of the corresponding capacitor of the other pair, a bidirectional reactive coupling being provided between a point on the connection between the capacitors of one pair and a point on the connection between the capacitors of the other pair, characterized in that each said capacitive component includes a respective further capacitor in series with the capacitors of the corresponding pair and in that a further bidirectional reactive coupling is provided between a point on the connection between one said further capacitor and the pair of capacitors corresponding thereto and a point on the connection between the other said further capacitor and the pair of capacitors corresponding thereto.

2. An arrangement as claimed claim 1, wherein each said further capacitor is variable in step with variation of the other said further capacitor, and the capacitor of the corresponding pair to which it is connected is fixed, means being provided for varying the capacitances of all said variable capacitors simultaneously.

3. An arrangement as claimed in claim 2, wherein each said bidirectional coupling includes a respective series-capacitor.

4. A filter as claimed in claim 3, wherein each said variable capacitor comprises a variable capacitor diode which is d.c.-connected to an input for a tuning voltage, said input being the same for all of said variable capacitance diodes.

5. A filter as claimed in claim 2, wherein each said variable capacitor comprises a variable capacitance diode which is d.c.-connected to an input for a tuning voltage, said input being the same for all of said variable capacitance diodes.

6. A filter as claimed in claim 1, wherein each said variable capacitor comprises a variable capacitance diode which is d.c.-connected to an input for a tuning voltage, said input being the same for all of said variable capacitance diodes.

7. An arrangement as claimed in claim 1, wherein each said bidirectional coupling includes a respective series-capacitor.

8. A filter as claimed in claim 7, wherein each said variable capacitor comprises a variable capacitance diode which is d.c.-connected to an input for a tuning voltage, said input being the same for all of said variable capacitance diodes.

* * * * *